United States Patent
Kobayashi

(10) Patent No.: US 9,372,468 B2
(45) Date of Patent: Jun. 21, 2016

(54) OPEN/CLOSED SENSING DEVICE, OPENING AND CLOSING DEVICE USING OPEN/CLOSED SENSING DEVICE, AND PROCESSING APPARATUS

(71) Applicant: FUJI XEROX CO., LTD., Minato-ku, Tokyo (JP)

(72) Inventor: Ken Kobayashi, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/613,492

(22) Filed: Feb. 4, 2015

(65) Prior Publication Data

US 2016/0062305 A1     Mar. 3, 2016

(30) Foreign Application Priority Data

Aug. 29, 2014  (JP) .................................. 2014-175698

(51) Int. Cl.
| | |
|---|---|
| *B65H 7/02* | (2006.01) |
| *G03G 21/16* | (2006.01) |
| *G01R 33/00* | (2006.01) |
| *H04N 1/00* | (2006.01) |

(52) U.S. Cl.
CPC ........ *G03G 21/1623* (2013.01); *G01R 33/0088* (2013.01); *E05Y 2900/608* (2013.01); *G03G 21/1633* (2013.01); *G03G 2221/166* (2013.01); *G03G 2221/169* (2013.01); *G03G 2221/1651* (2013.01); *G03G 2221/1687* (2013.01); *H04N 1/00519* (2013.01)

(58) Field of Classification Search
CPC .......... G03G 21/1623; G03G 21/1633; G03G 2221/1651; G03G 2221/166; G03G 2221/1687; G03G 2221/169; H04N 1/00519; E05Y 2900/608

See application file for complete search history.

(56) References Cited

U.S. PATENT DOCUMENTS

| | | | | |
|---|---|---|---|---|
| 6,163,388 | A * | 12/2000 | Lee ..................... | H04N 1/00795 358/488 |
| 6,356,741 | B1 * | 3/2002 | Bilotti ................ | H03K 17/9517 307/116 |

FOREIGN PATENT DOCUMENTS

JP        2002-344163 A    11/2002

* cited by examiner

*Primary Examiner* — David Gray
*Assistant Examiner* — Michael Harrison
(74) *Attorney, Agent, or Firm* — Sugrue Mion, PLLC

(57) ABSTRACT

An open/closed sensing device includes an opening and closing member, a member that receives the opening and closing member when the opening and closing member is closed, at least one magnetic force holder on one of the opening and closing member and the receiving member and that includes a conductive holding frame and a magnet held in the holding frame so as to magnetize the holding frame, a conductive to-be-attracted member that is disposed on a portion of the other one of the opening and closing member and the receiving member, the portion corresponding to the magnetic force holder, and to which the holding frame is attracted when the opening and closing member is closed, and a sensing circuit that connects in series the holding frame and the to-be-attracted member and that electrically senses whether the holding frame and the to-be-attracted member are in contact with each other.

8 Claims, 9 Drawing Sheets

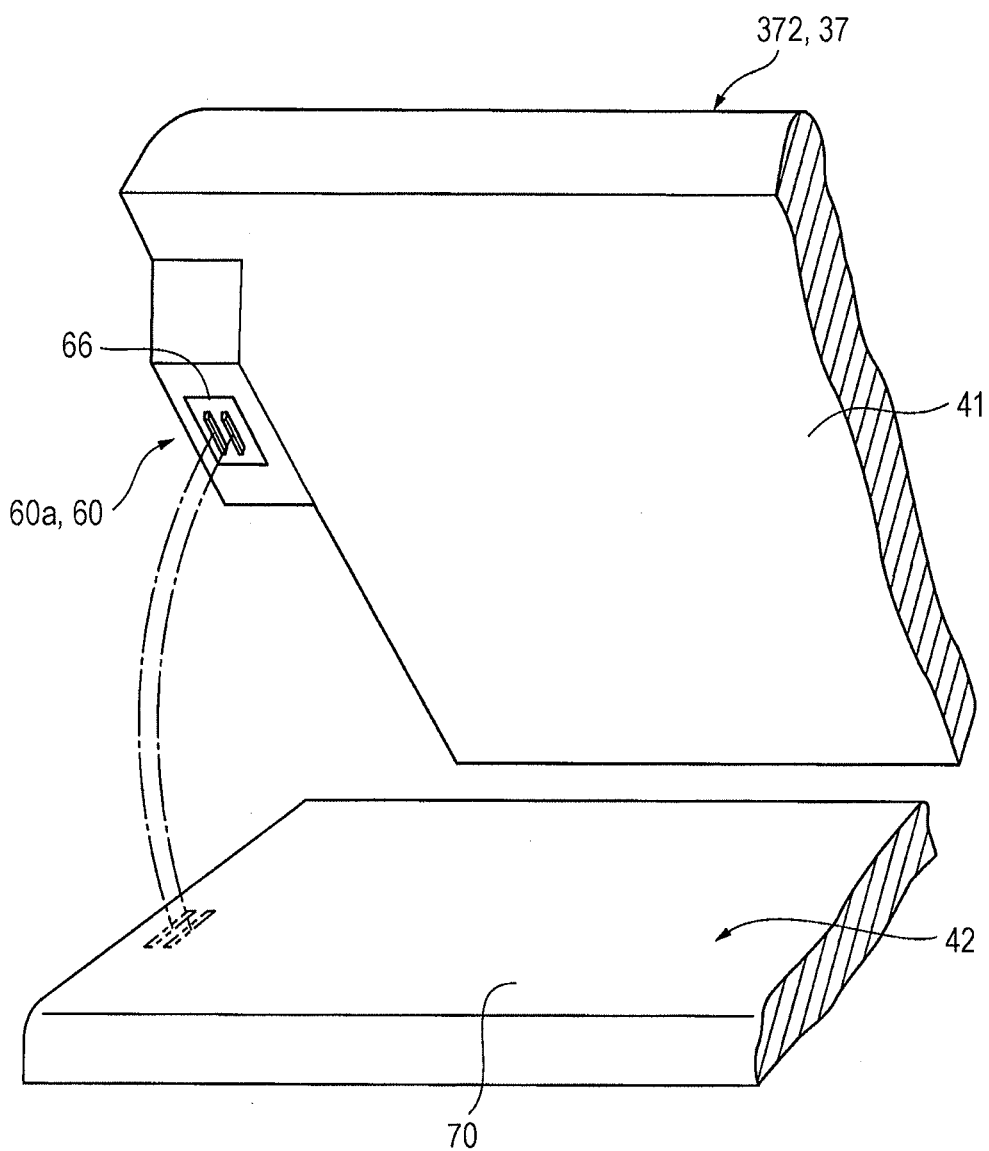

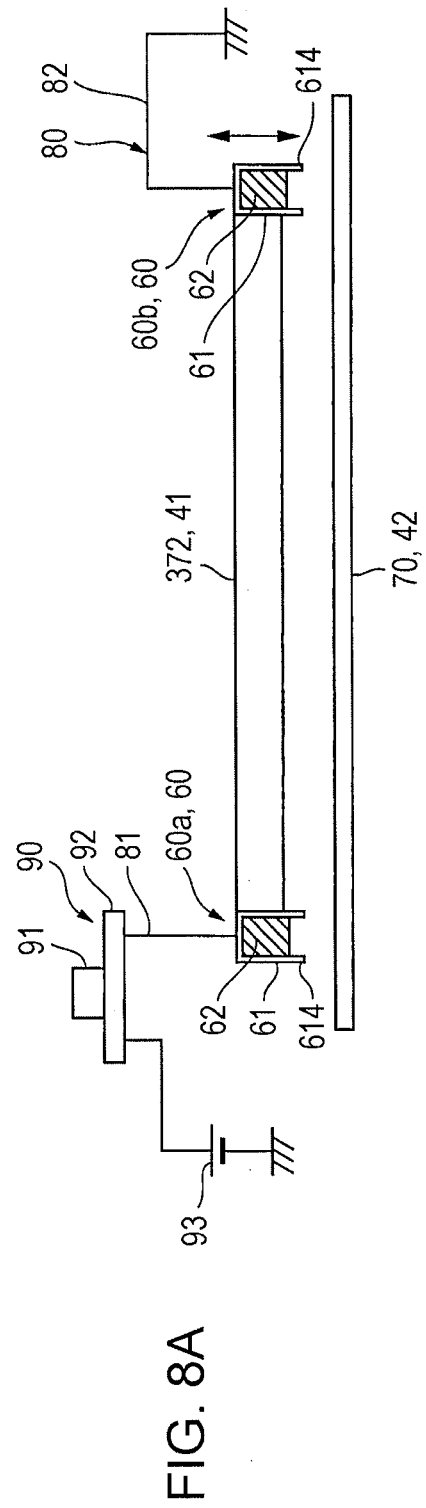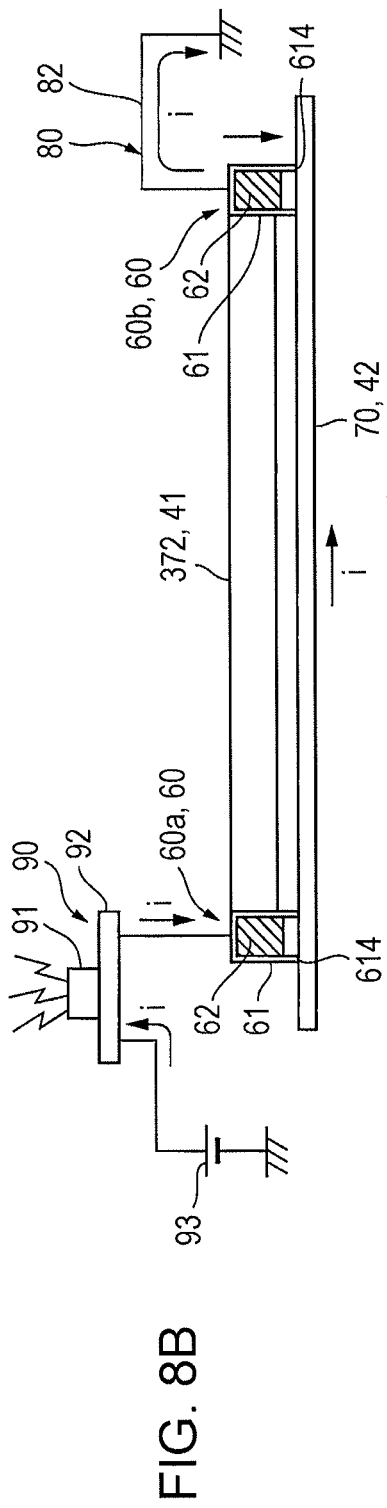
FIG. 8A
FIG. 8B

OPEN/CLOSED SENSING DEVICE, OPENING AND CLOSING DEVICE USING OPEN/CLOSED SENSING DEVICE, AND PROCESSING APPARATUS

CROSS-REFERENCE TO RELATED APPLICATIONS

This application is based on and claims priority under 35 USC 119 from Japanese Patent Application No. 2014-175698 filed Aug. 29, 2014.

BACKGROUND

1. Technical Field

The present invention relates to an open/closed sensing device, an opening and closing device using the open/closed sensing device, and a processing apparatus.

2. Summary

According to an aspect of the invention, there is provided an open/closed sensing device including an opening and closing member that is openable and closable, a receiving member that receives the opening and closing member when the opening and closing member is closed, at least one magnetic force holder that is disposed on one of the opening and closing member and the receiving member and that includes a holding frame, which is made of a conductive magnetic material, and a magnet, which is held in the holding frame in such a manner as to magnetize the holding frame, a to-be-attracted member that is made of a conductive magnetic material, disposed on at least a portion of the other one of the opening and closing member and the receiving member, the portion corresponding to the at least one magnetic force holder, and to which the holding frame of the at least one magnetic force holder is attracted when the opening and closing member is closed, and a sensing circuit that connects in series the holding frame of the at least one magnetic force holder and the to-be-attracted member and that electrically senses whether the holding frame and the to-be-attracted member are in contact with each other.

BRIEF DESCRIPTION OF THE DRAWINGS

Exemplary embodiments of the present invention will be described in detail based on the following figures, wherein:

FIG. 6 is a diagram illustrating an example of the open/closed sensing device that is used for sensing an open or closed state of the opening and closing lid of the document feed device according to the exemplary embodiment;

FIG. 8A is a diagram illustrating the details of the open/closed sensing device, which is used in the exemplary embodiment, and FIG. 8B is a diagram illustrating an operation example of the open/closed sensing device when the opening and closing lid of the document feed device is closed.

DETAILED DESCRIPTION

Overview of Exemplary Embodiment

Figure 1A:
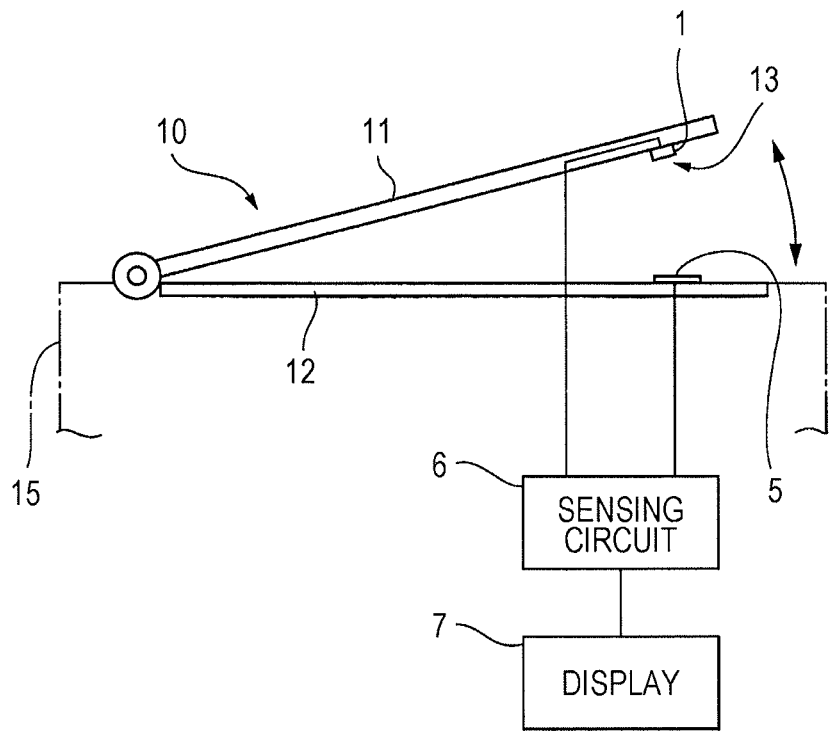
FIG. 1A is a diagram illustrating an overview of an exemplary embodiment of a processing apparatus that includes an opening and closing device to which the present invention is applied.

FIG. 1A is a diagram illustrating an overview of an exemplary embodiment of a processing apparatus that includes an opening and closing device to which the present invention is applied.

In FIG. 1A, the processing apparatus includes an apparatus housing 15, an opening and closing device 10 that is included in the apparatus housing 15, and a processing unit (not illustrated) that is incorporated within the apparatus housing 15 and that performs a predetermined processing.

In the present exemplary embodiment, the opening and closing device 10 includes an opening and closing member 11 that is openable and closable, a receiving member 12 that receives the opening and closing member 11 when the opening and closing member 11 is closed, and an open/closed sensing device 13 that senses an open or closed state of the opening and closing member 11.

Figure 1B:
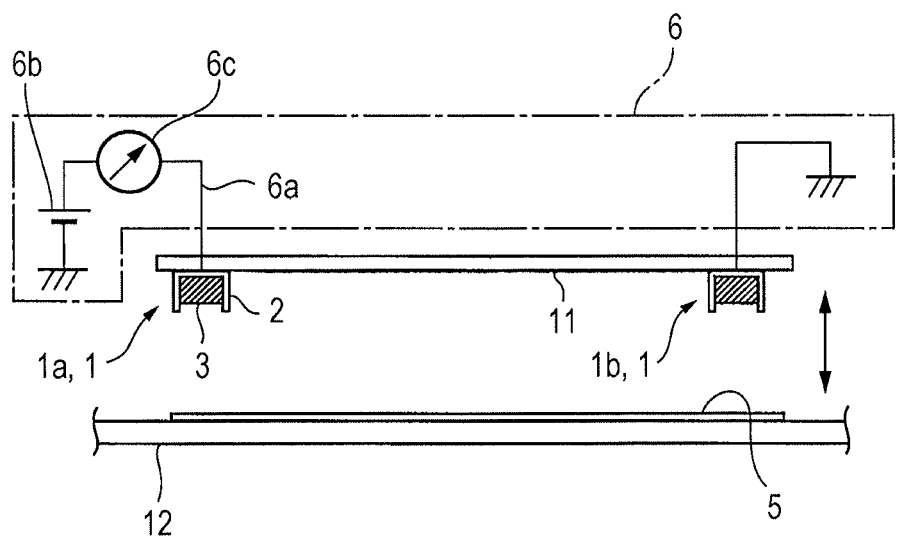
FIG. 1B is a diagram schematically illustrating an open/closed sensing device for use in the opening and closing device illustrated in FIG. 1A.

As illustrated in FIGS. 1A and 1B, the open/closed sensing device 13 is disposed on either the opening and closing member 11, which is openable and closable, or the receiving member 12, which receives the opening and closing member 11 when the opening and closing member 11 is closed, (the open/closed sensing device 13 is disposed on the opening and closing member 11 in the present exemplary embodiment), and includes at least one magnetic force holder 1 (magnetic force holders 1a and 1b in the present exemplary embodiment), a to-be-attracted member 5 that is made of a conductive magnetic material, and a sensing circuit 6. The at least one magnetic force holder 1 includes a holding frame 2, which is made of a conductive magnetic material, and a magnet 3 that is held in the holding frame 2 in such a manner as to magnetize the holding frame 2. The to-be-attracted member 5 is disposed on at least a portion of another member, which is either the opening and closing member 11 or the receiving member 12, (the to-be-attracted member 5 is disposed on at least a portion of the receiving member 12 in the present exemplary embodiment), the portion corresponding to the at least one magnetic force holder 1, and the holding frame 2 of the at least one magnetic force holder 1 is to be attracted to the to-be-attracted member 5 when the opening and closing member 11 is closed. The sensing circuit 6 connects in series the holding frame 2 of the at least one magnetic force holder 1 (holding frames 2 of the magnetic force holders 1a and 1b in the present exemplary embodiment) and the to-be-attracted member 5 and electrically senses whether the holding frame 2 and the to-be-attracted member 5 are in contact with each other.

In such technical measure, the processing apparatus may be any apparatus, such as an image forming apparatus that processes a recording material, as long as the apparatus includes a device corresponding to the opening and closing device 10. An example of such a device corresponding to the opening and closing device 10, which is used in such an image forming apparatus, is a device that includes, as opening and closing members, a cover member that opens and closes an opening of an apparatus housing 15 and an opening and closing lid for eliminating a paper jam of a document feed device that is disposed and fixed on the apparatus housing 15.

Regarding the open/closed sensing device 13, the at least one magnetic force holder 1 may be disposed on either the opening and closing member 11 or the receiving member 12, and the at least one magnetic force holder 1, which is to be disposed, may include one magnetic force holder or plural magnetic force holders.

Here, it is required that the holding frame 2 be made of a conductive magnetic material and magnetized by the magnet 3 and that a current be allowed to flow between the holding frames 2 and the to-be-attracted member 5.

The to-be-attracted member 5 may be, for example, a member that forms the receiving member 12 or the opening and closing member 11 or may be disposed on the member, which forms the receiving member 12 or the opening and closing member 11. In addition, the to-be-attracted member 5 may be made of a conductive magnetic material, and it is required that the at least one magnetic force holder 1 be attracted to the to-be-attracted member 5, and that a current be allowed to flow between the to-be-attracted member 5 and the holding frame 2 of the at least one magnetic force holder 1.

The term "to electrically sense whether the holding frame 2 and the to-be-attracted member 5 are in contact with each other" refers to sensing that the holding frame 2 and the to-be-attracted member 5 are in contact with each other when the sensing circuit 6, which connects the holding frame 2 and the to-be-attracted member 5 in series, is energized and sensing that the holding frame 2 and the to-be-attracted member 5 are not in contact with each other when the sensing circuit 6 is not energized.

As illustrated in FIG. 1B, an example of the sensing circuit 6 is a series circuit that is formed by connecting the holding frame 2 of the at least one magnetic force holder 1 and the to-be-attracted member 5 in series by a wiring member 6*a*, the series circuit having one end, which is grounded, and the other end, which is connected to a power source 6*b*, and the series circuit including a conductivity meter 6*c* therein.

A representative aspect or an exemplary aspect of the open/closed sensing device 13 will now be described.

First, a representative aspect of the magnetic force holder 1, is that the magnet 3 is held in the holding frame 2, which is substantially U-shaped when viewed in cross section, and that a portion of the holding frame 2 protrudes toward the to-be-attracted member 5 further than the magnet 3 does in such a manner as to serve as a contact portion that makes contact with the to-be-attracted member 5.

In the case where the magnet 3 of the magnetic force holder 1 is directly brought into contact with the to-be-attracted member 5, the magnetic force of the magnet 3 functions as an attraction force, and it is difficult to adjust the attraction force. However, like the present exemplary embodiment, in the aspect where a portion of the holding frame 2 of the magnetic force holder 1 and the to-be-attracted member 5 are brought into contact with each other, an attraction force between the holding frame 2 and the to-be-attracted member 5 may be adjusted by adjusting the area of a contact region between the holding frame 2 and the to-be-attracted member 5.

An example of the to-be-attracted member 5 that is used in the aspect where the open/closed sensing device 13 includes the plural magnetic force holders 1 is a common member with which all of the plural magnetic force holders 1 (magnetic force holders 1*a* and 1*b* in the present exemplary embodiment) are brought into contact. Although the to-be-attracted member 5 and the sensing circuit 6 may be provided for each of the plural magnetic force holders 1 (magnetic force holders 1*a* and 1*b* in the present exemplary embodiment), it is possible to use a common sensing circuit 6 by using the to-be-attracted member 5 as a common member.

A representative aspect of the sensing circuit 6 is that an energized state of the sensing circuit 6 obtained as a result of contact between the magnetic force holders 1 and the to-be-attracted member 5 is capable of being sensed. In the present exemplary embodiment, a circuit, which connects in series the magnetic force holder 1 and the to-be-attracted member 5, is capable of being sensed whether the circuit is closed as a result of contact between the magnetic force holder 1 and the to-be-attracted member 5 by the presence or absence of a current that flows through the circuit.

An example of the sensing circuit 6 that is used in the aspect where the open/closed sensing device 13 includes the plural magnetic force holders 1 (magnetic force holders 1*a* and 1*b* in the present exemplary embodiment) is the sensing circuit 6 that is capable of sensing whether all of the plural magnetic force holders 1 (magnetic force holders 1*a* and 1*b* in the present exemplary embodiment) are in contact with the to-be-attracted member 5. In the present exemplary embodiment, the sensing circuit 6 is capable of sensing a state where at least one of the magnetic force holders 1 is not in contact with the to-be-attracted member 5.

An exemplary aspect of the sensing circuit 6 is that the sensing circuit 6 includes a display 7, which includes a light-source element that turns on or off on the basis of sensing results. In the present exemplary embodiment, the sensing results obtained by the sensing circuit 6 are to be displayed on the display 7, and a user may recognize the open or closed state of the opening and closing member 11 by looking at the display 7.

The present invention will be described in further detail below on the basis of the exemplary embodiment illustrated in the accompanying drawings.

Exemplary Embodiment

Figure 2:
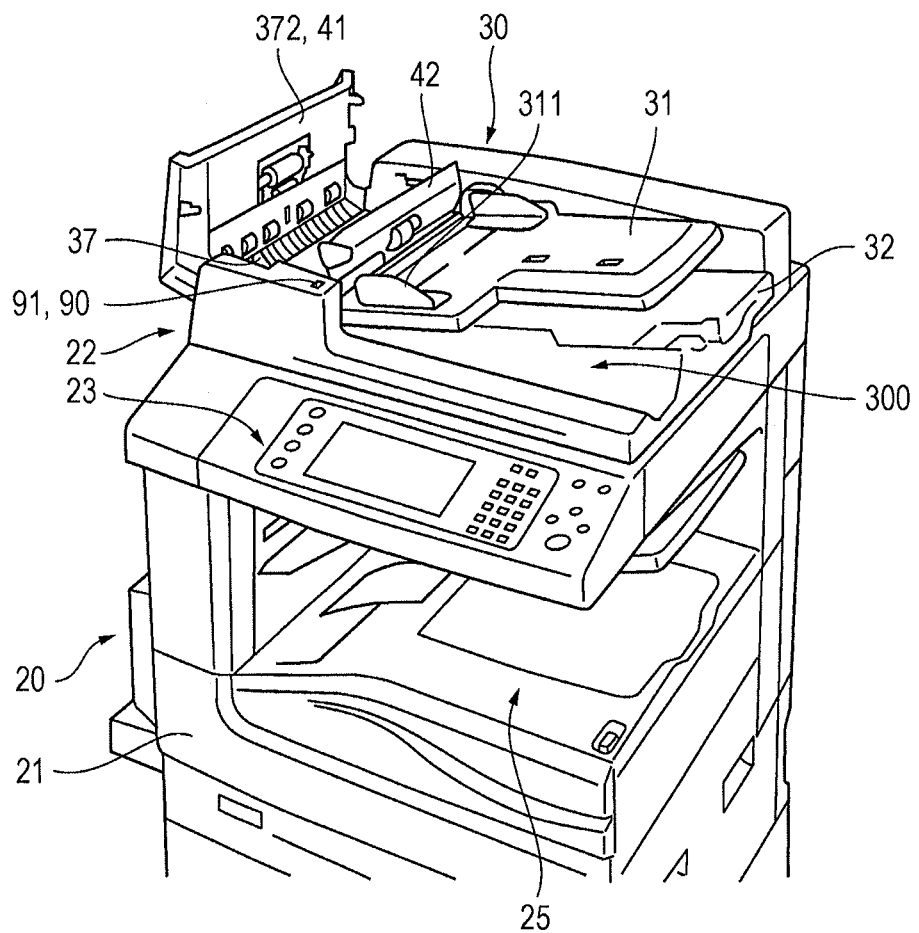
FIG. 2 is a diagram illustrating the appearance of an image forming apparatus that serves as the processing apparatus according to the exemplary embodiment.

FIG. 2 is a diagram illustrating the appearance of an image forming apparatus 20 that serves as the processing apparatus according to the exemplary embodiment.

In FIG. 2, the image forming apparatus 20 includes an image forming engine (not illustrated), which employs, for example, an electrophotographic system, an image reading device 22, and an operation panel 23, the image forming engine being disposed in a lower portion of an apparatus housing 21, and the image reading device 22 and the operation panel 23 being disposed above the apparatus housing 21. A recording-material-accommodating portion 25 in which a recording material on which an image has been formed by the image forming engine is to be ejected and accommodated is formed by forming a hollow portion in the apparatus housing 21 that is located at an intermediate position between the image forming engine and the image reading device 22.

In addition, in the present exemplary embodiment, a document feed device 30 that automatically feeds a document to the image reading device 22 is disposed and fixed on the image forming apparatus 20.

Image Reading Device

Figure 3:
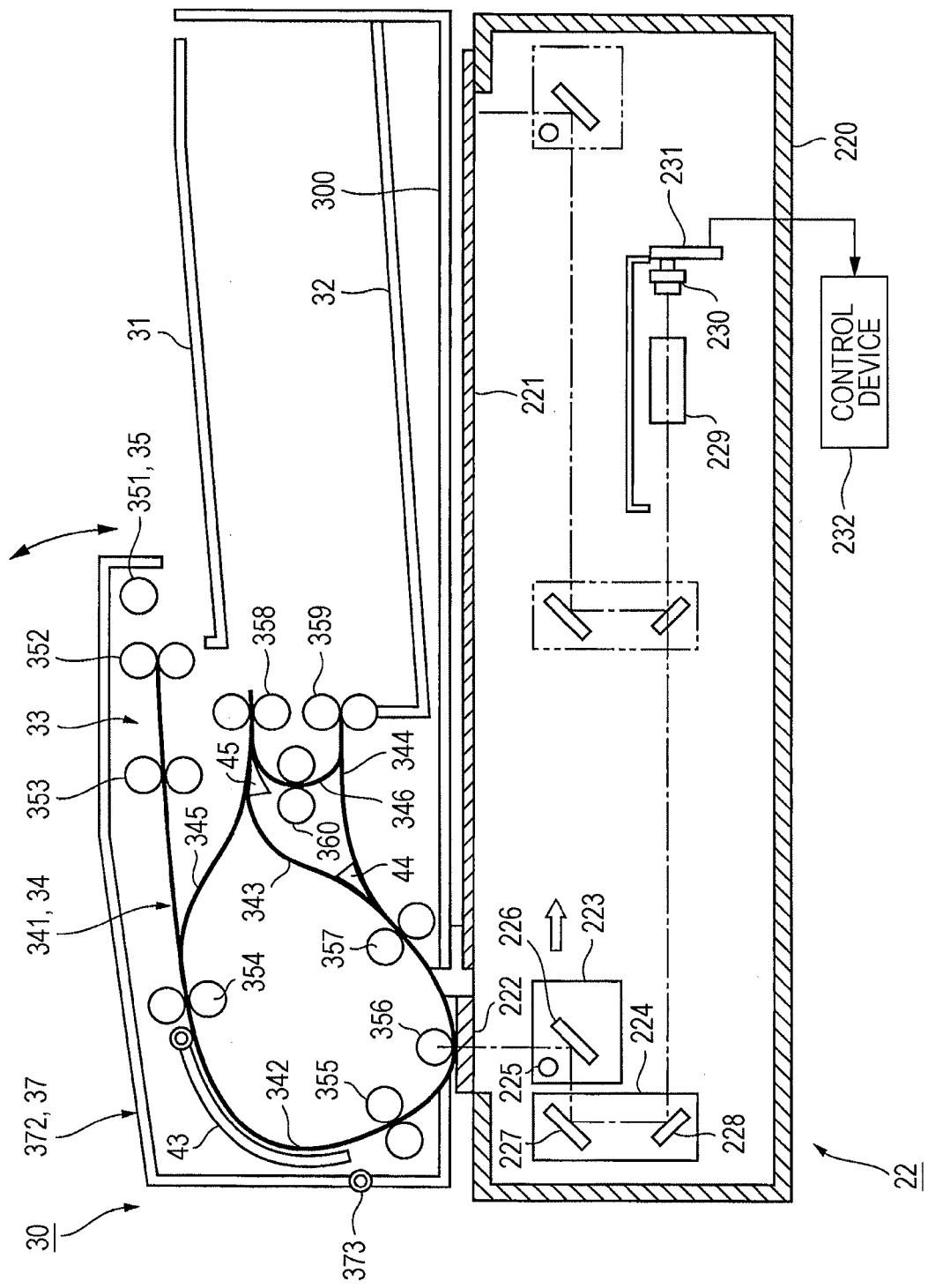
FIG. 3 is a diagram illustrating an example of a document feed device that is used in the exemplary embodiment.

As illustrated in FIG. 3, in the present exemplary embodiment, the image reading device 22 includes a first platen 221 that is disposed on an apparatus case 220 and on which a document is to be placed while being stationary and a second platen 222 that forms an opening used for reading a document that is being fed by the document feed device 30. The first and second platens 221 and 222 are covered by a platen cover 300 in such a manner as to be capable of being exposed or covered by the platen cover 300, and the document feed device 30 is disposed on the platen cover 300.

A full-rate carriage 223 that is stationary at an initial position located below the second platen 222 and that is configured to scan a document by moving along the entire length of the first platen 221 in such a manner as to read an image of the document and a half-rate carriage 224 that guides light obtained from the full-rate carriage 223 to an imaging portion are disposed in the apparatus case 220. The full-rate carriage 223 includes an illumination lamp 225 that radiates light onto a document and a first mirror 226 that reflects light that has been reflected by the document. The half-rate carriage 224 includes a second mirror 227 and a third mirror 228 that guide the light obtained from the first mirror 226 to the imaging portion.

In addition, an imaging lens 229 that optically focuses the light obtained from the third mirror 228 on the imaging portion so as to form an optical image and an image sensor 230 (a charge coupled device (CCD) image sensor is used in the present exemplary embodiment) that converts the optical image, which has been formed as a result of the light being focused on the imaging portion by the imaging lens 229, into an image signal by photoelectric conversion are disposed in the apparatus case 220, and the image signal obtained by the image sensor 230 is input to a control device 232 via a driving substrate 231.

Document Feed Device

As illustrated in FIG. 2 and FIG. 3, in the present exemplary embodiment, the document feed device 30 includes a document table 31 that is disposed above the platen cover 300 and on which a document whose image has not yet been read is to be placed, a document-accommodating unit 32 that is disposed between the platen cover 300 and the document table 31 and in which a document whose image has been read is to be accommodated, a path-forming component 33 that is arranged at a position, which is above the platen cover 300 and adjacent to the document table 31 and the document-accommodating portion 32, and that forms a transport path 34 along which a document is to be guided, transport components 35 that transport a document along the transport path 34, which is formed of the path-forming component 33, and an apparatus cover 37 that covers the path-forming component 33 and the transport components 35.

Document Table

Figure 4:
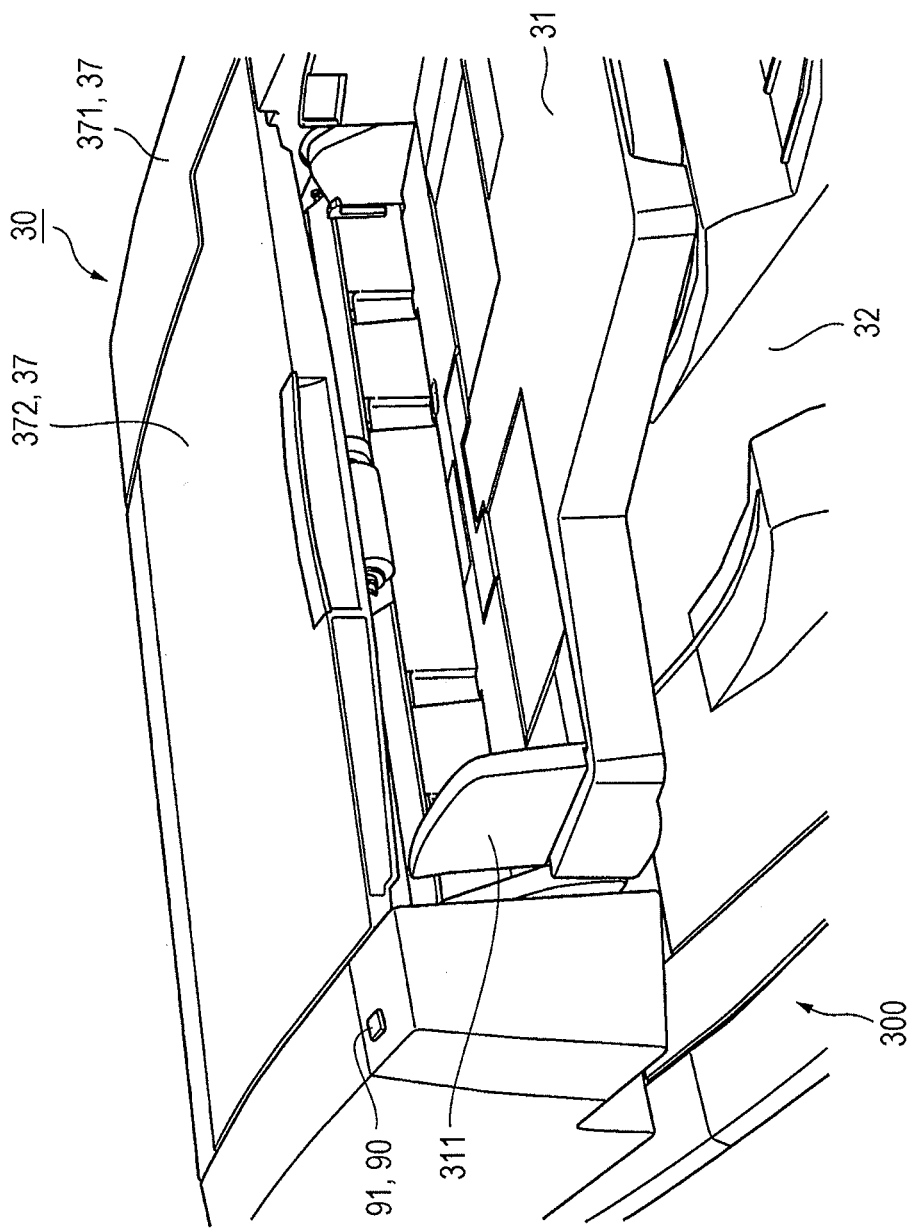
FIG. 4 is a diagram illustrating a principal portion in a state where an opening and closing lid of the document feed device, which is used in the exemplary embodiment, is closed.
Figure 5:
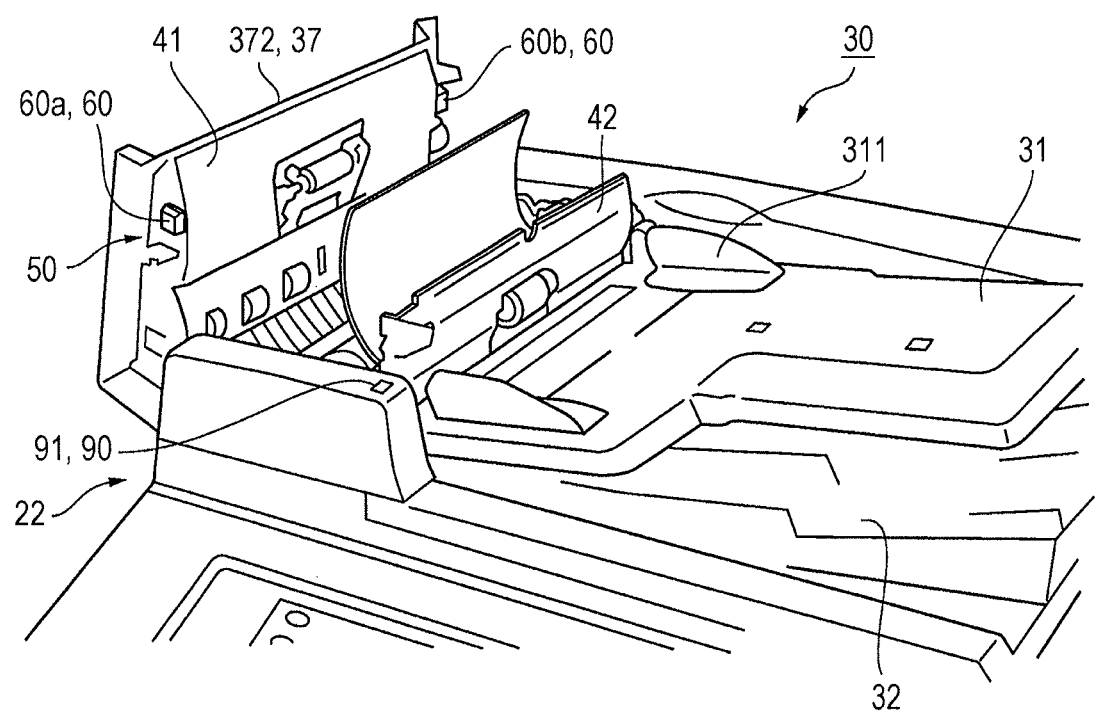
FIG. 5 is a diagram illustrating a state where the opening and closing lid of the document feed device according to the exemplary embodiment is open.

As illustrated in FIG. 3 to FIG. 5, in the present exemplary embodiment, the document table 31 includes a pair of document-guiding-and-aligning units 311 that are movable and that align the side edges of documents. The pair of document-guiding-and-aligning units 311 is configured to align documents placed on the document table 31 at a reference position (the position where the centers of the documents are positioned at the center of the document table 31 in the present exemplary embodiment).

The document table 31 is disposed above the document-accommodating unit 32, and the document table 31 is capable of being in an upright position as may be necessary from the standpoint of facilitating pick-up of documents from the document-accommodating unit 32.

Path-Forming Component

As illustrated in FIG. 3, the path-forming component 33 includes the transport path 34.

The transport path 34 includes a first transport path 341 to which a document, which is placed on the document table 31, is to be sent first in a substantially linear manner, a second transport path 342 that is formed downstream of the first transport path 341 and curved in a substantially C shape, a third transport path 343 and a fourth transport path 344 that are formed as a result of a downstream portion of the second transport path 342 branching into two paths, a fifth transport path 345 that is formed at a position between an intermediate portion of the third transport path 343 and a downstream portion of the first transport path 341, and a sixth transport path 346 that is formed at a position between the intermediate portion of the third transport path 343 and an intermediate portion of the fourth transport path 344.

The transport path 341 to 346 are formed by partitioning a path space, through which a document is to be transported, by partition members, and representative aspects of such partition members include guide chutes 41 and 42 (see FIG. 5 and FIG. 6) that serve as a pair of guiding members, which have guide surfaces extending in such a manner that front and rear surfaces of a document are to be parallel to the guide surfaces, and a guide baffle 43 (see FIG. 3) that serves as a one-side-guiding member, which is curved so as to follow the outer side of the second transport path 342 and which is capable of rotating about its fulcrum.

In the path-forming component 33, a first switching gate 44 that switches between the third transport path 343 and the fourth transport path 344 is disposed at a branch at which the third transport path 343 and the fourth transport path 344 branch, and a second switching gate 45 that switches between the third transport path 343, the fifth transport path 345, and sixth transport path 346 is disposed at a branch at which the third transport path 343, the fifth transport path 345, and sixth transport path 346 branch.

Transport Components

In the present exemplary embodiment, the following rollers are disposed on the first transport path 341: a feed roller 351 that sends out documents placed on the document table 31, delivery rollers 352 that separate and send out the documents, which have been sent by the feed roller 351, one by one to a further downstream position, transport rollers 353 that transport one of the documents, which has been sent by the delivery rollers 352, to a further downstream position, and pre-positioning rollers 354 that cause the document, which has been transported by the transport rollers 353, to be curved in a loop shape that follows the shape of the second transport path 342 and transports the document to a further downstream position.

The following rollers are disposed on the second transport path 342: positioning rollers 355 that temporarily stop rotating so as to position a document, which has been transported by the pre-positioning rollers 354, and then start rotating again in accordance with a predetermined timing so as to feed the document to the second platen 222, a platen roller 356 that is disposed so as to face the second platen 222 and that transports a document, whose image is to be read, along the second platen 222 while pressing the document, and conveying rollers 357 that convey a document, which has passed over the second platen 222, to a further downstream position.

Forward-reverse rollers 358 that transport a document in a forward direction and then transport the document in a reverse direction are disposed in the vicinity of an exit of the third transport path 343.

Ejection rollers 359 that eject a document to the document-accommodating unit 32 are disposed in the vicinity of an exit of the fourth transport path 344.

Pre-ejection rollers 360 that transport a document, which has been transported in the reverse direction by the forward-reverse rollers 358, toward the ejection rollers 359 are disposed on the sixth transport path 346.

In the present exemplary embodiment, the way in which a document is transported differs between a single-sided recording mode and a double-sided recording mode.

In the single-sided recording mode, a document is transported to the second platen 222 through the feed roller 351, the delivery rollers 352, the transport rollers 353, the pre-positioning rollers 354, and the positioning rollers 355, and an image of a first surface of the document is read. After that, the document is transported in the forward direction in such a manner as to sequentially pass through the platen roller 356 and the conveying rollers 357 and is transported toward the third transport path 343 by the first switching gate 44. Then, the document is transported in the reverse direction by the forward-reverse rollers 358 and transported toward the sixth transport path 346 by the second switching gate 45. Finally, the document is ejected to the document-accommodating unit 32 through the pre-ejection rollers 360 and the ejection rollers 359.

On the other hand, in the double-sided recording mode, after the image of the first surface of a document is read in a similar manner to the single-sided recording mode, the document is transported in the forward direction in such a manner as to sequentially pass through the platen roller 356 and the conveying rollers 357 and is transported in the reverse direction by the forward-reverse rollers 358. After that, the document passes through the second transport path 342 again through the fifth transport path 345 and is transported to the second platen 222 with the first and second surfaces of the document reversed. Then an image of the second surface of the document is read, and after that, the document is transported in the forward direction in such a manner as to sequentially pass through the platen roller 356 and the conveying rollers 357. The document is transported toward the fourth transport path 344 by the first switching gate 44 and finally is ejected to the document-accommodating unit 32 through the ejection rollers 359.

Apparatus Cover

As illustrated in FIG. 3 and FIG. 6, in the present exemplary embodiment, the apparatus cover 37 includes a cover body 371, which covers the path-forming component 33 and the transport components 35 and which is disposed on the platen cover 300, and an opening and closing lid 372 that serves as an opening and closing member and that is formed in a portion of the cover body 371 located above the first transport path 341 and the second transport path 342 in such a manner as to be openable and closable while one end of the opening and closing lid 372 serves as a fulcrum 373.

In the present exemplary embodiment, the opening and closing lid 372 is configured to also be used as the guide chute 41, which is one of guiding members, and the guide chute 42, which is the other one of the guiding members, functions as a receiving member that receives the opening and closing lid 372 and is arranged in such a manner as to be capable of being in an upright position while one end of the guide chute 42 serves as a fulcrum.

Thus, for example, in the case where a document has become jammed in the first transport path 341 or the second transport path 342, the opening and closing lid 372 may be opened in order to remove the document as illustrated in FIG. 5.

In the case where a document, which has been transported to the side on which the second platen 222 is present, has become jammed, the document may be removed by opening the opening and closing lid 372 and then arranging the guide chute 42 in an upright position as illustrated in FIG. 5.

Open/Closed Sensing Device

In exemplary embodiment, an open/closed sensing device 50 that senses an open or closed state of the opening and closing lid 372 of the document feed device 30 is provided.

As illustrated in FIG. 4 to FIG. 7, in the present exemplary embodiment, the open/closed sensing device 50 includes plural magnetic force holders 60 (two, specifically, magnetic force holders 60a and 60b in the present exemplary embodiment) that are disposed on an end portion of the opening and closing lid 372, which is spaced apart from the fulcrum 373 and which may freely rotate, a to-be-attracted plate 70 that is formed on a surface of the guide chute 42, which corresponds to the receiving member that receives the opening and closing lid 372, and to which the plural magnetic force holders 60 are to be attracted, a sensing circuit 80 (see FIG. 8) that electrically senses whether the plural magnetic force holders 60 and the to-be-attracted plate 70 are in contact with each other, and a display 90 that displays sensing results obtained by the sensing circuit 80.

In the present exemplary embodiment, the guide chute 41 is formed on the inner side of the opening and closing lid 372, and the plural magnetic force holders 60 are disposed on the end portions of the guide chute 41 in the width direction of the guide chute 41. The magnetic force holders 60 are arranged in such a manner as to protrude toward the guide chute 42 further than the guide surface of the guide chute 41 does. When the opening and closing lid 372 is closed, the plural magnetic force holders 60 are in contact with and attracted to the to-be-attracted plate 70 of the guide chute 42, and a gap through which a document is capable of being transported is secured between the guide chute 41 and the guide chute 42.

Magnetic Force Holders

As illustrated in FIG. 6 and FIGS. 7A to 7C, in the present exemplary embodiment, each of the magnetic force holders 60 includes a holding frame 61 that is made of a conductive metal and that is substantially U-shaped when viewed in cross section, a magnet 62 that is held in the holding frame 61, and a mounting component 65 that is used for mounting the holding frame 61 in a to-be-equipped portion 66.

In the holding frame 61, an area surrounded by a connecting portion 611 and a pair of leg portions 612 is a magnet holding portion 613, and the magnet 62 that has a rectangular parallelepiped shape is attracted to and held in the magnet holding portion 613. Contact pieces 614 that protrude further outward than the position of the magnet 62, which is held in the magnet holding portion 613, are formed integrally with the pair of leg portions 612.

The mounting component 65 is made of an insulating synthetic resin material and includes a hinge portion 651 and a pair of lid bodies 652 and 653 that are openable and closable with the hinge portion 651 interposed therebetween. The hinge portion 651 and the pair of lid bodies 652 and 653 are integrally formed, and an accommodating portion 654 in which the holding frame 61 and the magnet 62, which is held in the holding frame 61, are to be accommodated is formed in a space enclosed by the pair of lid bodies 652 and 653. Portions of the pair of lid bodies 652 and 653 on the opposite side to the hinge portion 651 form an opening 655 that allows the contact pieces 614 of the holding frame 61 to protrude out therefrom, and a constraining mechanism (formed of a hook portion 656 and a hook groove 657 in the present exemplary embodiment) that constrains the pair of lid bodies 652 and 653 are formed on the portions of the pair of lid bodies 652 and 653. A pair of support hooks 658 that are capable of being elastically deformed are formed on side edge portions of the lid body 652, which are adjacent to the hinge portion 651. Note that reference numeral 659 indicates an urging spring that presses down the holding frame 61 against the accommodating portion 654.

Figure 7A:
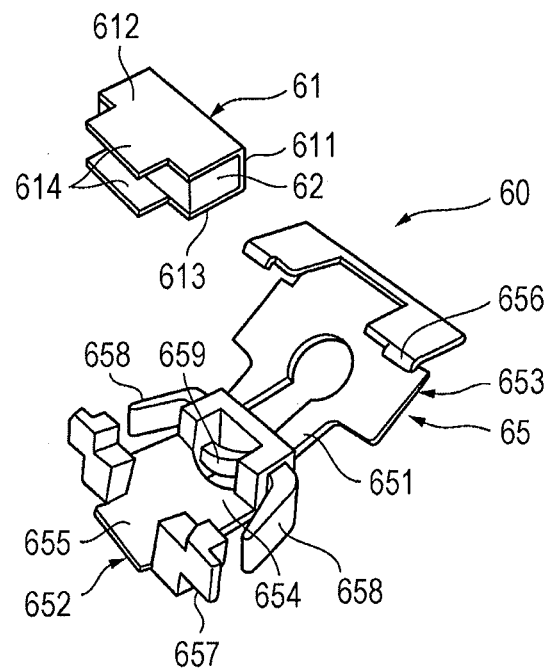
FIG. 7A is a diagram illustrating a configuration example of a magnetic force holder that is used in the exemplary embodiment.
Figure 7B:
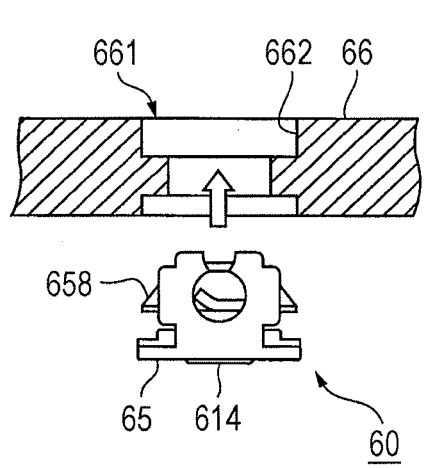
FIG. 7B is a diagram illustrating the magnetic force holder and a to-be-equipped portion in which the magnetic force holder is to be mounted.
Figure 7C:
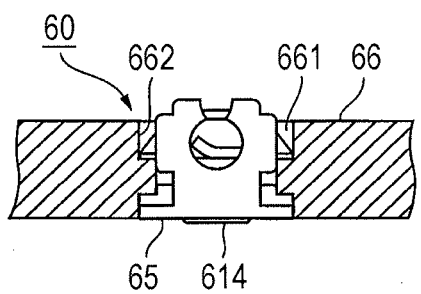
FIG. 7C is a diagram illustrating a state where the magnetic force holder is mounted in the to-be-equipped portion.

As illustrated in FIG. 6 and FIGS. 7A and 7C, each of the to-be-equipped portions 66 has a mounting hole 661 that has a substantially rectangular shape when viewed in cross section and into which the mounting component 65 of one of the magnetic force holders 60 may be inserted, and a step portion 662 on which the support hooks 658 of the magnetic force holder 60 are to be hooked as a result of returning to their original positions after elastic deformation is formed in the mounting hole 661.

As illustrated in FIG. 7A, in the present exemplary embodiment, the assembly of each of the magnetic force holders 60 is completed by making the holding frame 61 hold the magnet 62, causing the pair of lid bodies 652 and 653 of the mounting component 65 to be in an open state with the hinge portion 651 interposed between the pair of lid bodies 652 and 653, causing the holding frame 61, which holds the magnet 62, to be accommodated in the accommodating portion 654 of the lid body 652, and constraining the holding frame 61 and the magnet 62 in the mounting component 65 by constraining the pair of lid bodies 652 and 653 by the hook portion 656 and the hook groove 657 in such a manner as to cause the pair of lid bodies 652 and 653 to be in an closed state.

Subsequently, as illustrated in FIG. 7B, the magnetic force holder 60 is inserted into the mounting hole 661 of the to-be-equipped portion 66 in such a manner as to be oriented in a predetermined direction, and as illustrated in FIG. 7C, the magnetic force holder 60 is pressed against the mounting hole 661 until the support hooks 658 of the mounting component 65 of the magnetic force holder 60 are hooked on the step portion 662 of the mounting hole 661, so that the magnetic force holders 60 is mounted in the to-be-equipped portion 66.

In this state, the contact pieces 614 of the holding frame 61 of the magnetic force holders 60 are positioned in such a manner as to protrude toward the to-be-attracted plate 70 of the guide chute 42 further than the guide chute 41, which is formed on the opening and closing lid 372, does.

To-be-Attracted Plate

As illustrated in FIG. 6 and FIG. 8A, in the present exemplary embodiment, the to-be-attracted plate 70 formed on the guide chute 42 is made of a conductive metal and is also used as a sheet metal that forms a surface of the guide chute 42. Thus, in the present exemplary embodiment, the to-be-attracted plate 70 extends integrally with the guide chute 42 in the width direction of the guide chute 42 that crosses the direction in which a document is to be transported. However, although the guide chute 42 is disposed on the platen cover 300, in the case where the guide chute 42 is fixed on the platen cover 300 via a conductive member such as a bracket or a frame, the guide chute 42 is grounded and isolated.

Note that, although the to-be-attracted plate 70 is also used as the sheet metal of the guide chute 42 in the present exemplary embodiment, the present invention is not limited to this, and it is obvious that the to-be-attracted plate 70 may be a separate member that has conductivity and that is disposed and fixed on the guide chute 42.

Sensing Circuit and Display

As illustrated in FIG. 4, FIG. 5, and FIG. 8A, in the present exemplary embodiment, the sensing circuit 80 connects in series the magnetic force holders 60, which are disposed on the opening and closing lid 372, and the to-be-attracted plate 70 of the guide chute 42 and is configured to electrically sense whether the magnetic force holders 60 and the guide chute 42 are in contact with one another.

The display 90 is formed by disposing and fixing a display lamp 91, which includes, for example, a light emitting diode (LED), on a portion of the cover body 371 of the apparatus cover 37 of the document feed device 30, the portion being located in the vicinity of a corner portion of the cover body 371 on the side on which the document table 31 is disposed. A drive power source 93 is connected to a control board 92 of the display lamp 91.

In the present exemplary embodiment, in the sensing circuit 80, the holding frame 61 of one of the magnetic force holders 60 (magnetic force holder 60a in the present exemplary embodiment) and the control board 92 of the display lamp 91 are connected by a wiring member 81, so that the power source 93 of the display 90, the display lamp 91, and the holding frame 61 of the one of the magnetic force holders 60 (magnetic force holder 60a in the present exemplary embodiment) are connected in series, and the holding frame 61 of the other one of the magnetic force holders 60 (magnetic force holder 60b in the present exemplary embodiment) is grounded through a wiring member 82.

In the present exemplary embodiment, assume that, in the case where a document has become jammed in the document feed device 30, the opening and closing lid 372 is opened in order to remove the document, which has become jammed.

In this case, as illustrated in FIG. 8A, in a state where the opening and closing lid 372 of the document feed device 30 is open, the magnetic force holders 60 (magnetic force holders 60a and 60b in the present exemplary embodiment) are not in contact with the to-be-attracted plate 70, and thus, the magnetic force holders 60 and the to-be-attracted plate 70 are not electrically connected to one another, so that a current does not flow through the sensing circuit 80.

Therefore, in the present exemplary embodiment, the display lamp 91 of the display 90 does not turn on.

Next, assume that the opening and closing lid 372 of the document feed device 30 is closed.

In this case, by the time the opening and closing lid 372 is closed, the plural magnetic force holders 60 (magnetic force holders 60a and 60b in the present exemplary embodiment), which are disposed and fixed on the opening and closing lid 372, are moved toward the to-be-attracted plate 70 of the guide chute 42. When the plural magnetic force holders 60 are close to the to-be-attracted plate 70, the holding frames 61 of the magnetic force holders 60 are magnetized by the corresponding magnets 62, and the contact pieces 614 of the holding frames 61 are brought into contact with and attracted to the to-be-attracted plate 70.

Then, as illustrated in FIG. 8b, since the magnetic force holders 60 (magnetic force holders 60a and 60b in the present exemplary embodiment) are in contact with the to-be-attracted plate 70, a current flows between the magnetic force holders 60 and the to-be-attracted plate 70, and the sensing circuit 80, which is a series circuit that includes the power source 93, the display lamp 91, the magnetic force holder 60a, the to-be-attracted plate 70, and the magnetic force holder 60b, becomes closed. As a result, a predetermined operating current i flows through the sensing circuit 80, and the display lamp 91 is turned on.

In the present exemplary embodiment, in the case where, among the magnetic force holders 60 (magnetic force holders 60a and 60b in the present exemplary embodiment), for example, the magnetic force holder 60a is in contact with the to-be-attracted plate 70, but on the other hand, the magnetic force holder 60b is not in contact with the to-be-attracted plate 70 due to a reaction force generated by closing the opening and closing lid 372 and the like even though, a current does not flow between the magnetic force holder 60b and the to-be-attracted plate 70, and thus, the sensing circuit 80 is not closed due to the area through which the current does not flow.

In the present exemplary embodiment, the magnets 62 of the magnetic force holders 60 are not directly brought into contact with the to-be-attracted plate 70. Since an attraction force formed of the magnetic force of the magnetic force holders 60 depends on the areas of contact regions between the contact pieces 614 of the holding frames 61 and the to-be-attracted plate 70, there is a smaller concern that the attraction force formed of the magnetic force of the magnetic force holders 60 may become unnecessarily large compared with the case where the magnet 62 is directly brought into contact with the to-be-attracted plate 70. Therefore, there is only a small concern that an operating force required for opening the opening and closing lid 372 of the document feed device 30 may become unnecessarily large.

Modification

Figure 9:
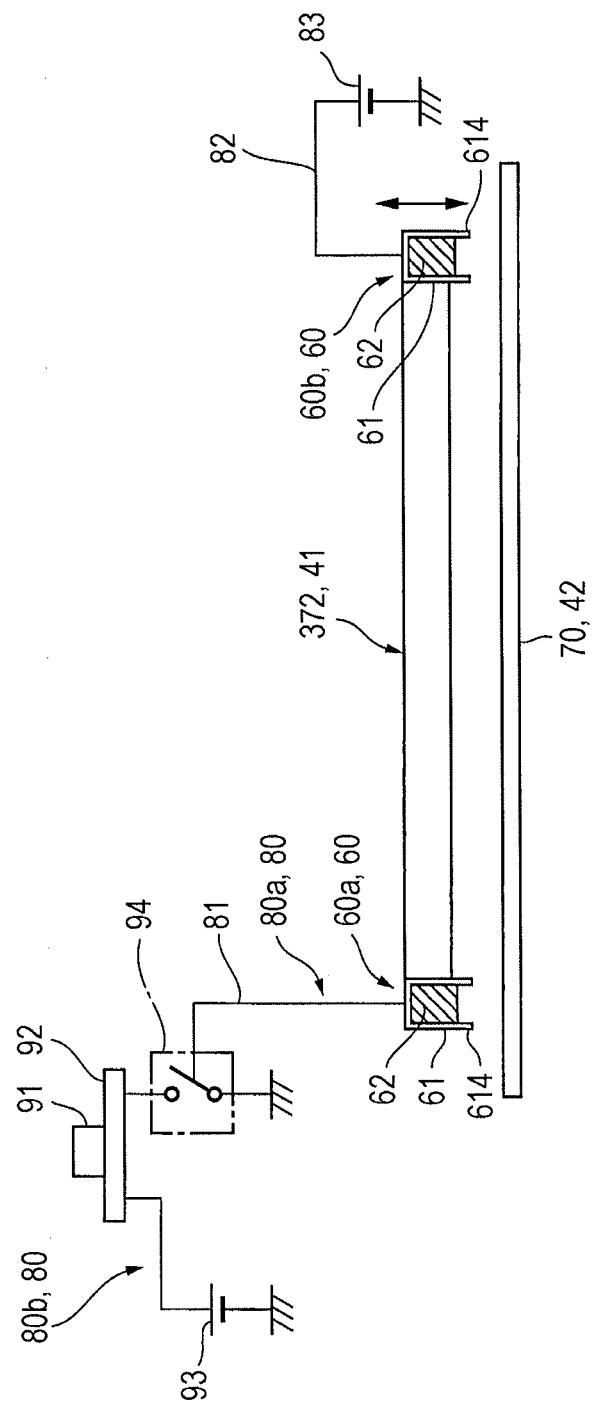
FIG. 9 is a diagram illustrating a modification of the open/closed sensing device, which is used in the exemplary embodiment.

Although, in the present exemplary embodiment, the sensing circuit 80 employs a method of causing portions in which the magnetic force holders 60 (magnetic force holders 60a and 60b in the present exemplary embodiment) and the to-be-attracted plate 70 come into contact with or move away from one another to function as switching elements, the present invention is not limited to this, and, for example, a modification such as that illustrated in FIG. 9 may be employed.

In the modification illustrated in FIG. 9, for example, the power source 93 is connected to the control board 92 of the display lamp 91 and grounded through a switching element (e.g., a transistor) 94, a base electrode of the switching element 94 and the holding frame 61 of one of the magnetic force holders 60 (magnetic force holder 60a in the present modification) are connected to each other via the wiring member 81, the holding frame 61 of the other one of the magnetic force holders 60 (magnetic force holder 60b in the present modification) and a power source 83 are connected in series to each other via the wiring member 82, and one end of the power source 83 is grounded.

According to the present modification, for example, when the opening and closing lid 372 of the document feed device 30 is closed, the holding frames 61 of the magnetic force holders 60 (magnetic force holders 60a and 60b in the present modification) and the to-be-attracted plate 70 are in contact with one another and a current flows between the holding frames 61 of the magnetic force holders 60 and the to-be-attracted plate 70. In this case, the current flows through a first circuit 80a (corresponding to the sensing circuit 80) that connects in series the magnetic force holder 60a, the to-be-attracted plate 70, the magnetic force holder 60b, and the power source 83, and when the current is applied to the base electrode of the switching element 94, the switching element 94 is operated so as to be closed. As a result, a second circuit 80b (corresponding to the sensing circuit 80) that connects the power source 93, the display lamp 91, and the switching element 94 in series is closed, and the display lamp 91 turns on.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An open/closed sensing device comprising:
an opening and closing member that is openable and closable;
a receiving member that receives the opening and closing member when the opening and closing member is closed;
at least one magnetic force holder that is disposed on one of the opening and closing member and the receiving member and that includes a holding frame, which is made of a conductive magnetic material, and a magnet, which is held in the holding frame in such a manner as to magnetize the holding frame;
a to-be-attracted member that is made of a conductive magnetic material, disposed on at least a portion of the other one of the opening and closing member and the receiving member, the portion corresponding to the at least one magnetic force holder, and to which the holding frame of the at least one magnetic force holder is attracted when the opening and closing member is closed; and
a sensing circuit that connects in series the holding frame of the at least one magnetic force holder and the to-be-attracted member and that electrically senses whether the holding frame and the to-be-attracted member are in contact with each other.

2. The open/closed sensing device according to claim 1, wherein, in the at least one magnetic force holder, the magnet is held in the holding frame, which is substantially U-shaped when viewed in cross section, and a portion of the holding frame protrudes toward the to-be-attracted member further than the magnet does in such a manner as to serve as a contact portion that makes contact with the to-be-attracted member.

3. The open/closed sensing device according to claim 1, wherein the at least one magnetic force holder includes a plurality of magnetic force holders, and
wherein the to-be-attracted member is a common member with which all of the plurality of magnetic force holders are to be brought into contact.

4. The open/closed sensing device according to claim 1, wherein an energized state of the sensing circuit obtained as a result of contact between the at least one magnetic force holder and the to-be-attracted member is capable of being sensed.

5. The open/closed sensing device according to claim 1, wherein the at least one magnetic force holder includes a plurality of magnetic force holders, and
wherein the sensing circuit is capable of sensing whether all of the plurality of magnetic force holders are in contact with the to-be-attracted member.

6. The open/closed sensing device according to claim 1, wherein the sensing circuit includes a display, which includes a light-source element that turns on or off on a basis of sensing results.

7. An opening and closing device comprising:
an opening and closing member that is openable and closable;
a receiving member that receives the opening and closing member when the opening and closing member is closed; and the open/closed sensing device according to claim 1 that senses an open state and a closed state of the opening and closing member.

8. A processing apparatus comprising:

an apparatus housing;

the opening and closing device according to claim 7 that is disposed in the apparatus housing; and a processing unit that is incorporated within the apparatus housing and that performs a predetermined processing.

* * * * *